(12) United States Patent
Fleming et al.

(10) Patent No.: US 9,057,861 B2
(45) Date of Patent: Jun. 16, 2015

(54) APPARATUS FOR CABLE ORGANIZATION

(71) Applicant: International Business Machines Corporation, Armonk, NY (US)

(72) Inventors: Mark S. Fleming, Oro Valley, AZ (US); Steven E. McNeal, Tucson, AZ (US); Michael A. Nelsen, Longmont, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/957,135

(22) Filed: Aug. 1, 2013

(65) Prior Publication Data
US 2015/0036992 A1    Feb. 5, 2015

(51) Int. Cl.
G02B 6/00 (2006.01)
G02B 6/44 (2006.01)
H02G 3/04 (2006.01)
H05K 7/14 (2006.01)

(52) U.S. Cl.
CPC ............ G02B 6/4471 (2013.01); G02B 6/4454 (2013.01); G02B 6/4455 (2013.01); G02B 6/4453 (2013.01); G02B 6/4452 (2013.01); H02G 3/045 (2013.01); H05K 7/1491 (2013.01)

(58) Field of Classification Search
CPC ....................................... G02B 6/4452–6/4455
USPC ............................................................ 385/135
See application file for complete search history.

(56) References Cited

U.S. PATENT DOCUMENTS

| | | | |
|---|---|---|---|
| 7,901,147 B1 * | 3/2011 | de Jong et al. | 385/95 |
| 8,254,741 B2 * | 8/2012 | Imaizumi et al. | 385/135 |
| 2007/0258212 A1 * | 11/2007 | Malone et al. | 361/699 |
| 2012/0241195 A1 * | 9/2012 | Doll | 174/135 |
| 2012/0281958 A1 * | 11/2012 | Petersen et al. | 385/135 |

* cited by examiner

*Primary Examiner* — Jerry Blevins
(74) *Attorney, Agent, or Firm* — Kunzler Law Group

(57) ABSTRACT

A cable management apparatus includes a flexible planar body and a plurality of channels aligned along a longitudinal axis on a surface of the flexible planar body. The flexible planar body has a plurality of fasteners aligned along a first edge and a second edge of the flexible planar body, the flexible planar body capable of forming a substantially circular bundle along the longitudinal axis. Each channel of the plurality of channels is configured to secure an individual cable to keep the cable from intersecting with another cable.

20 Claims, 6 Drawing Sheets

APPARATUS FOR CABLE ORGANIZATION

FIELD

The subject matter disclosed herein relates to a cable management apparatus and more particularly relates to a cable management apparatus for improved organization, identification, installation, and removal of cables.

BACKGROUND

Large scale computing facilities have numerous interconnected servers and other electronic equipment. A server is often connected to another server or equipment by multiple fibre channel cables. There are often other cables running through the facility alongside the fibre channel cables, such as power cables, Ethernet cables, and the like. Cables are often organized by being tied together in bundles and/or run through large channels under a raised floor. In addition, cables may be organized by applying apparatuses at either end of a cable bundle to keep the connectors separated. Replacing or moving servers and other electronic equipment requires disconnecting and reconnecting certain cables, replacing some cables, and leaving other cables disconnected.

BRIEF SUMMARY

A cable management apparatus includes a flexible planar body and a plurality of channels aligned along a longitudinal axis on a surface of the flexible planar body. In one embodiment, the flexible planar body has a plurality of fasteners along a first edge and a second edge of the flexible planar body, the flexible planar body capable of forming a substantial circular bundle along the longitudinal axis. In another embodiment, each channel of the plurality of channels is configured to secure an individual cable to keep the cable from intersecting with another cable.

The cable management apparatus, in one configuration, has a flexible planar body that forms a substantially circular bundle along a longitudinal axis. In one configuration, the plurality of channels faces inward along the longitudinal axis of the substantially circular bundle. In another configuration, the plurality of channels faces outward along the longitudinal axis of the substantially circular bundle. In some configurations, the substantially circular bundle is capable of bending around a curved surface.

In one embodiment, the composition of the flexible planar body and the plurality of channels includes a heat resistant material. In another embodiment, the composition of the flexible planar body and the plurality of channels includes a material with a high thermal conductivity. In certain embodiments, the composition of the plurality of channels includes magnetic material.

In some embodiments, the each channel of the plurality of channels are substantially parallel to the other channels of the plurality of channels. In one embodiment, each channel of the plurality of channels has one or more openings along a longitudinal span of the channel.

In a particular embodiment, the cable management apparatus includes a flexible planar body and a plurality of channels along a longitudinal axis on a surface of the flexible planar body, the flexible planar body having a plurality of fasteners aligned along the longitudinal axis on a first edge and a second edge of the flexible planar body and capable of forming a substantially circular bundle along the longitudinal axis.

In yet another embodiment, the cable management apparatus includes a flexible planar body and a plurality of channels along a longitudinal axis on a surface of the flexible planar body, the flexible planar body having a plurality of fasteners aligned along a longitudinal axis on an edge of the flexible planar body and a surface of the flexible planar body and capable of forming a substantially circular bundle along the longitudinal axis.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

The description of elements in each figure may refer to elements of proceeding figures. Like numbers refer to like elements in all figures, including alternate embodiments of like elements.

Figure 1:
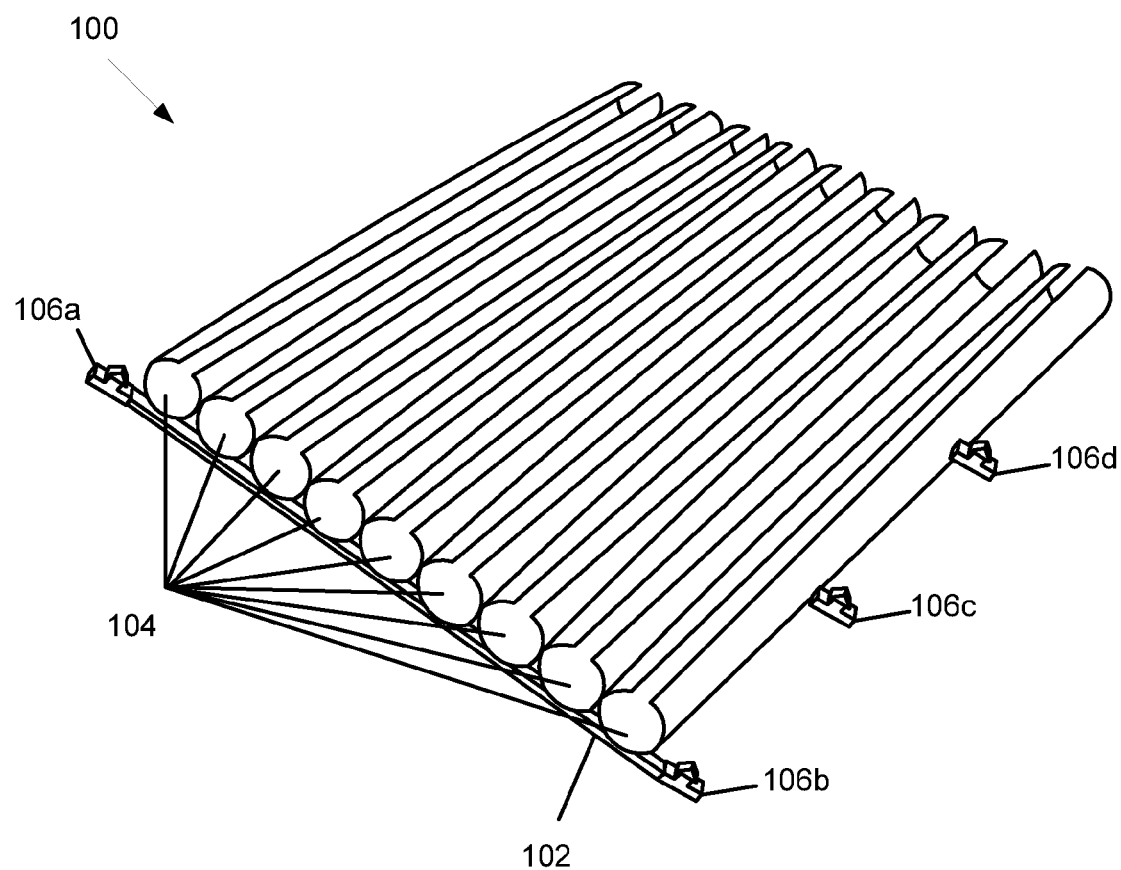
FIG. 1 is a schematic diagram illustrating one embodiment of a cable management apparatus.

FIG. 1 is a schematic diagram illustrating one embodiment of a cable management apparatus. The apparatus 100 has a flexible planar body 102 with a plurality of channels 104 aligned along a longitudinal axis, wherein each channel 104 of the plurality of channels 104 is configured to secure an individual cable to keep the cable from intersecting with another cable. The channels 104 keep cables from entangling with each other, allowing for easier identification, installation, and removal of cables. The flexible planar body 102 is capable of forming a substantially circular bundle along the longitudinal axis. In one embodiment, the flexible planar body 102 has a plurality of fasteners 106 aligned along the longitudinal axis on a first edge and a second edge. The first edge of the flexible planar body 102 may be substantially opposite the second edge, or the two edges may not be substantially opposite each other. In another embodiment, the flexible planar body 102 has a plurality of fasteners 106 aligned along the longitudinal axis on an edge and a surface of the flexible planar body 102. The plurality of fasteners 106 on the edge of the flexible planar body 102 and the surface of the flexible planar body 102, in one embodiment, may be substantially parallel.

A cable transporting electrical power generates heat, and an environment having confined spaces and numerous power cables may generate an enormous amount of heat. In one embodiment, the flexible planar body 102 and the plurality of channels 104 can be made out of heat resistant material to allow easier handling of the apparatus 100. Alternatively, the flexible planar body 102 and the plurality of channels 104 can be made from a material with high thermal conductivity to facilitate the dissipation of heat into the surrounding environment. In another embodiment, the flexible planar body 102 may have a plurality of openings (e.g., pores) to facilitate the dissipation of heat generated by cables.

Figure 2:
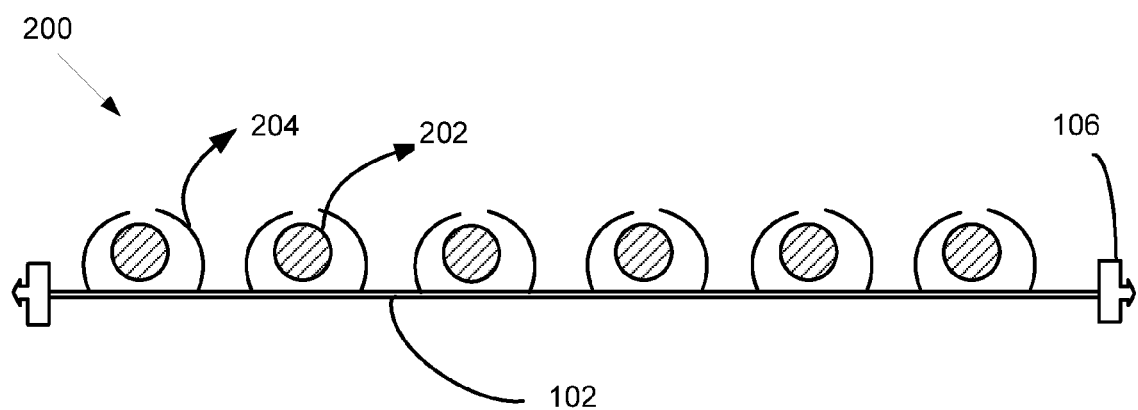
FIG. 2 is a schematic diagram illustrating a cross section of an embodiment of a cable management apparatus.
Figure 3:
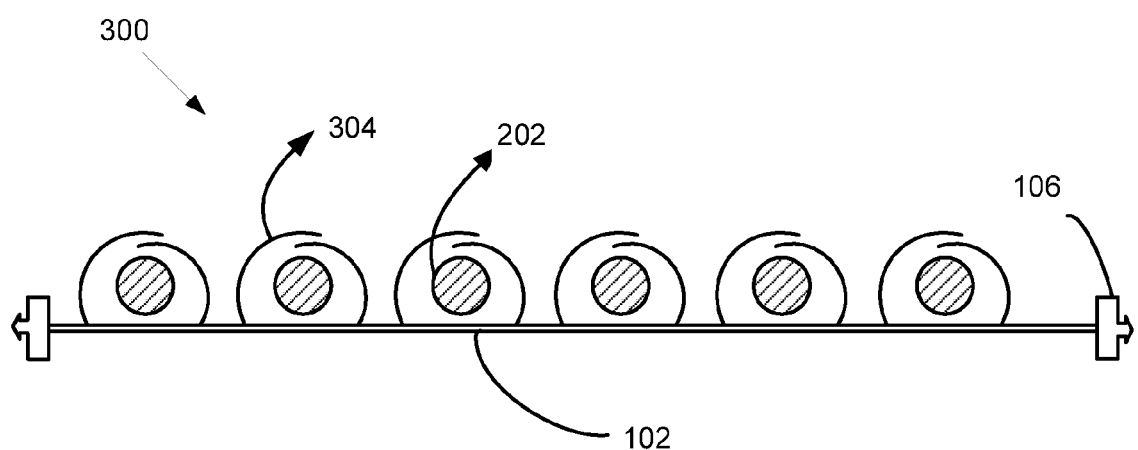
FIG. 3 is a schematic diagram illustrating a cross section of another embodiment of a cable management apparatus.
Figure 4:
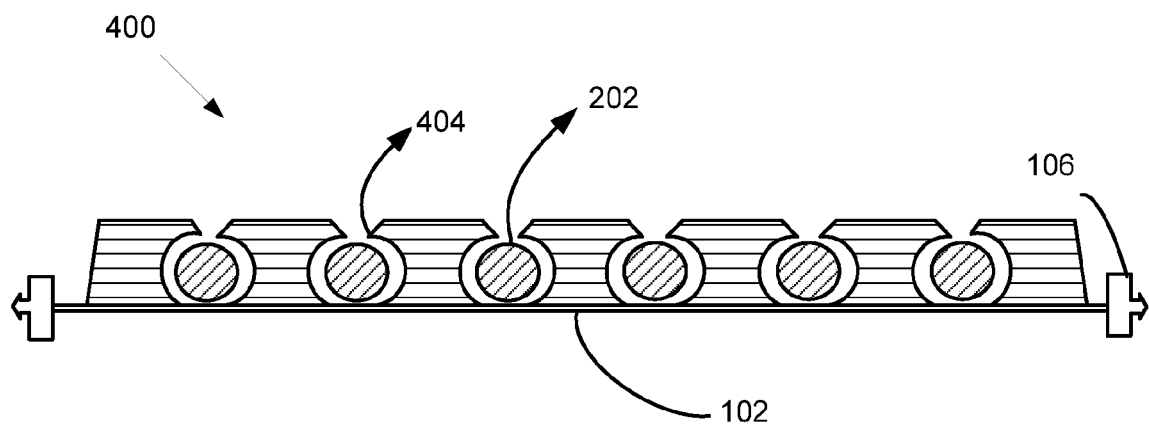
FIG. 4 is a schematic diagram illustrating a cross section of a further embodiment of a cable management apparatus.

FIGS. 2-4 are schematic diagrams illustrating cross sections of different embodiments of a cable management apparatus. The apparatus 200 has a flexible planar body 102 with a surface having a plurality of channels 204 and a plurality of fasteners 106 aligned along a longitudinal axis on a first edge and a second edge. Similarly, the apparatuses 300 and 400 each have a flexible planar body 102 with a surface having a plurality of channels 304, 404 and a plurality of fasteners 106 aligned along a longitudinal axis on a first edge and a second edge. The plurality of fasteners 106 may take various forms, including without limitation, a cable tie, a hook and loop fastener, a snap fastener, a hook and eye closure, a clip, a clasp, a latch, and the like. In FIGS. 2-4, the cables 202 are secured within channels 204, 304, 404. The channels 104 may have numerous different configurations. In one configuration, a channel 204 sits on a surface of the flexible planar body 102, the channel 204 formed by non-overlapping sides with the interior surface of the channel 204 exposed. In another configuration, a channel 304 sits on a surface of the flexible planar body 102, the channel 304 formed by overlapping sides. In yet another configuration, a channel 404 is a part of the flexible planar body 102. In some configurations, a channel 204, 304, 404 is made out of a magnetic material that allows a cable with a metallic outer covering to attach magnetically to the channel 204, 304, 404. For example, an Ethernet cable having a thin metallic outer covering can be secured to a channel 204, 304, 404 made of magnetic material, obviating the need for physical ways to secure the cable to the channel 204, 304, 404.

In one embodiment, each channel 204, 304, 404 of the plurality of channels 204, 304, 404 is substantially parallel to the other channels of the plurality of channels. This ensures that the cables secured within a channel 204, 304, 404 will not be tangled together, making it easier to identify cables for removal or replacement. In another embodiment, each channel 204, 304, 404 of the plurality of channels 204, 304, 404 has one or more openings along its longitudinal span for the installation or removal of a cable, or for better heat dissipation. For example, a channel 204, 304, 404 may have one continuous opening along its longitudinal span. Alternatively, a channel 204, 304, 404 may have regularly spaced openings along its longitudinal span, allowing it to more securely hold a cable in place while still allowing easy access for installation or removal of a cable, or for dissipating heat from a cable carrying electricity into the surrounding environment.

Figure 5:
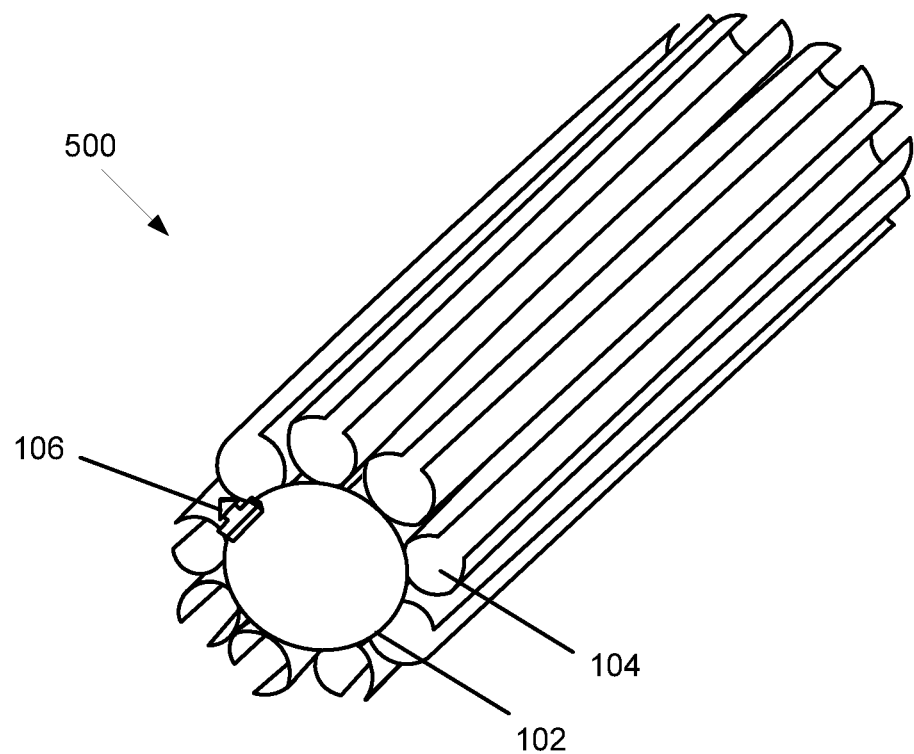
FIG. 5 is a schematic diagram illustrating another embodiment of a cable management apparatus.

FIG. 5 is a schematic diagram illustrating another embodiment of a cable management apparatus. The apparatus 500 has a flexible planar body 102 with a plurality of channels 104 forming a substantially circular bundle along a longitudinal axis. In one configuration, the substantially circular bundle is formed by joining the plurality of fasteners 106 on the first edge and the second edge. In another configuration, the substantially circular bundle is formed by joining the plurality of fasteners 106 on an edge and a surface of the flexible planar body 102. In this configuration, a portion of the flexible planar body 102 overlaps with another portion of the flexible planar body 102. The plurality of channels 104 faces outward along the longitudinal axis of the substantially circular bundle. This configuration allows for easier access to cables secured within the plurality of channels 104. In some configurations, the substantially circular bundle is capable of bending around a curve. This configuration allows the apparatus 500 to be installed around corners, bends, and confined spaces.

Figure 6:
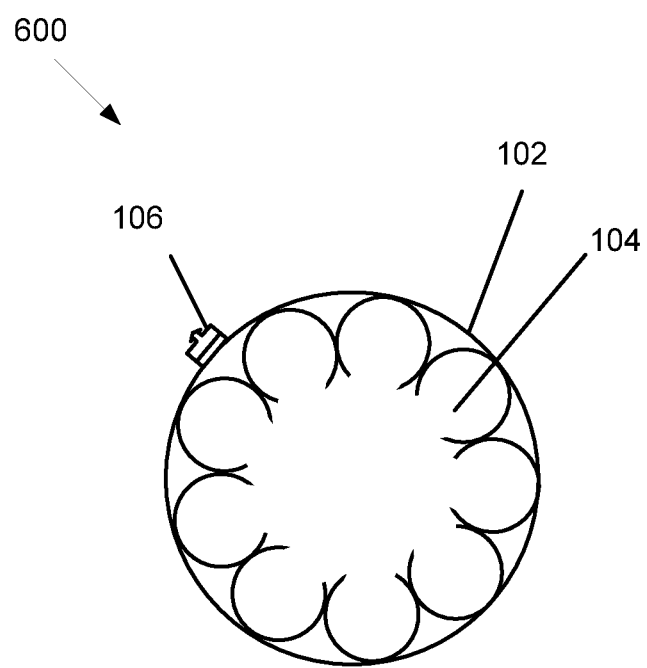
FIG. 6 is a schematic diagram illustrating a further embodiment of a cable management apparatus.

FIG. 6 is a schematic diagram illustrating a further embodiment of a cable management apparatus. The apparatus 600 has a flexible planar body 102 with a plurality of channels 104 forming a substantially circular bundle along a longitudinal axis. In one configuration, the substantially circular bundle is formed by joining the plurality of fasteners 106 on the first edge and the second edge. In another configuration, the substantially circular bundle is formed by joining the plurality of fasteners 106 on an edge and a surface of the flexible planar body 102. In this configuration, a portion of the flexible planar body 102 overlaps with another portion of the flexible planar body 102. The plurality of channels 104, in one configuration, faces inward along the longitudinal axis of the substantially circular bundle. This configuration allows the other side of the flexible planar body 102 to serve as a protective outer covering for cables secured within the plurality of channels 104. In some configurations, the substantially circular bundle is capable of bending around a curve. This configuration allows the apparatus 600 to be installed around corners, bends, and confined spaces.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A cable management apparatus comprising:
   a flexible planar body having a plurality of fasteners aligned along an edge and a surface of the flexible planar body, the flexible planar body capable of rolling into a cylindrical bundle along the longitudinal axis, wherein fasteners on the edge are coupled to fasteners on the surface of the flexible planar body; and a plurality of channels aligned along the longitudinal axis on a surface of the flexible planar body, each channel of the plurality of channels sitting atop the surface of the flexible planar body and having overlapping sides, configured to secure an individual cable to keep the cable from intersecting with another cable.

2. The apparatus of claim 1, wherein the flexible planar body forms a cylindrical bundle along the longitudinal axis, the plurality of channels arranged in a cylindrical configuration.

3. The apparatus of claim 2, wherein the plurality of channels faces inward along the longitudinal axis of the cylindrical bundle.

4. The apparatus of claim 2, wherein the plurality of channels faces outward along the longitudinal axis of the cylindrical bundle.

5. The apparatus of claim 2, wherein the cylindrical bundle is capable of bending around a curved surface.

6. The apparatus of claim 1, wherein the composition of the flexible planar body and the plurality of channels comprises a heat resistant material.

7. The apparatus of claim 1, wherein the composition of the flexible planar body and the plurality of channels comprises a material with high thermal conductivity.

8. The apparatus of claim 1, wherein the composition of the plurality of channels comprises a magnetic material.

9. The apparatus of claim 1, wherein each channel of the plurality of channels is substantially parallel to the other channels of the plurality of channels.

10. The apparatus of claim 1, wherein each channel of the plurality of channels has one or more openings along a longitudinal span of the channel.

11. A cable management apparatus comprising:

a flexible planar body having a plurality of fasteners aligned along a longitudinal axis on an edge and a surface of the flexible planar body, the flexible planar body capable of rolling into a cylindrical bundle along the longitudinal axis, wherein fasteners on the edge are coupled to fasteners on the surface of the flexible planar body; and a plurality of channels aligned along the longitudinal axis on a surface of the flexible planar body, each channel of the plurality of channels sitting atop the surface of the flexible planar body and having overlapping sides, configured to secure an individual cable to keep the cable from intersecting with another cable.

12. The apparatus of claim 11, wherein the flexible planar body forms a cylindrical bundle along the longitudinal axis, the plurality of channels arranged in a cylindrical configuration.

13. The apparatus of claim 12, wherein the plurality of channels faces inward along the longitudinal axis of the cylindrical bundle.

14. The apparatus of claim 12, wherein the plurality of channels faces outward along the longitudinal axis of the cylindrical bundle.

15. The apparatus of claim 12, wherein the cylindrical bundle is capable of bending around a curved surface.

16. A cable management apparatus comprising:

a flexible planar body having a plurality of fasteners aligned along a longitudinal axis on an edge of the flexible planar body and a surface of the flexible planar body, the flexible planar body capable of rolling into a cylindrical bundle along the longitudinal axis, wherein fasteners on the edge are coupled to fasteners on the surface of the flexible planar body; and a plurality of channels aligned along the longitudinal axis on the surface of the flexible planar body, each channel of the plurality of channels sitting atop the surface of the flexible planar body and having overlapping sides, configured to secure an individual cable to keep the cable from intersecting with another cable.

17. The apparatus of claim 16, wherein the flexible planar body forms a cylindrical bundle along the longitudinal axis, the plurality of channels arranged in a cylindrical configuration.

18. The apparatus of claim 17, wherein the plurality of channels faces inward along the longitudinal axis of the cylindrical bundle.

19. The apparatus of claim 17, wherein the plurality of channels faces outward along the longitudinal axis of the cylindrical bundle.

20. The apparatus of claim 17, wherein the cylindrical bundle is capable of bending around a curved surface.

* * * * *